(12) United States Patent
Kilcher et al.

(10) Patent No.: US 10,281,734 B2
(45) Date of Patent: *May 7, 2019

(54) OPTICAL MEMS SCANNING MICRO-MIRROR WITH ANTI-SPECKLE COVER

(71) Applicant: North Inc., Kitchener (CA)

(72) Inventors: Lucio Kilcher, Montreux (CH); Nicolas Abele, Lausanne (CH); Faouzi Khechana, Crissier (CH)

(73) Assignee: North Inc, Kitchener, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/925,527

(22) Filed: Mar. 19, 2018

(65) Prior Publication Data

US 2018/0210224 A1 Jul. 26, 2018

Related U.S. Application Data

(63) Continuation of application No. 14/692,517, filed on Apr. 21, 2015, now Pat. No. 9,921,415, which is a
(Continued)

(51) Int. Cl.
*G02B 27/48* (2006.01)
*G03B 21/28* (2006.01)
*G02B 26/08* (2006.01)
*B81C 1/00* (2006.01)
*G02B 5/02* (2006.01)
(Continued)

(52) U.S. Cl.
CPC ............... *G02B 27/48* (2013.01); *B81C 1/00* (2013.01); *G02B 5/0215* (2013.01); *G02B 5/0278* (2013.01); *G02B 26/0833* (2013.01); *G02B 26/0875* (2013.01); *G02B 26/105* (2013.01);
(Continued)

(58) Field of Classification Search
CPC ...... G02B 27/48; G03B 21/28; H04N 9/3129; H04N 9/3141
See application file for complete search history.

(56) References Cited

U.S. PATENT DOCUMENTS 5,521,747 A * 5/1996 Engle .................. G02B 26/06
359/259
7,023,603 B2 * 4/2006 Reboa ................. G02B 26/004
359/251
(Continued)

*Primary Examiner* — William C Dowling
(74) *Attorney, Agent, or Firm* — Thomas Mahon

(57) ABSTRACT

Optical MEMS scanning micro-mirror comprising: —a movable scanning micro-mirror (101), being pivotally connected to a MEMS body (102) substantially surrounding the lateral sides of the micro-mirror, —a transparent window (202) substantially covering the reflection side of the micro-mirror; —wherein a piezo-actuator assembly (500) and a layer of deformable transparent material (501) are provided on the outer portion of said window (202); —the piezo-actuator assembly (500) being arranged at the periphery of the layer of transparent material (501); —said piezo-actuator assembly (500) and transparent material (501) cooperating so that when actuated, the piezo-actuator assembly (500) causes micro-deformation of the transparent material (501), thereby providing an anti-speckle effect. The invention also provides the corresponding micro-projection system and method for reducing speckle.

20 Claims, 13 Drawing Sheets

Related U.S. Application Data continuation of application No. 13/638,308, filed as application No. PCT/EP2010/055764 on Apr. 28, 2010, now Pat. No. 9,010,936.

(51) Int. Cl.
  *G02B 26/10*   (2006.01)
  *H04N 9/31*   (2006.01)

(52) U.S. Cl.
  CPC .......... *G03B 21/28* (2013.01); *H04N 9/3129* (2013.01); *Y10T 29/42* (2015.01)

(56) References Cited

U.S. PATENT DOCUMENTS

| | | | |
|---|---|---|---|
| 8,267,532 B2* | 9/2012 | Khechana | G02B 7/003 353/119 |
| 2007/0274075 A1* | 11/2007 | Nagamune | G02B 5/0221 362/259 |
| 2008/0192327 A1* | 8/2008 | Abu-Ageel | G02B 3/14 359/237 |
| 2009/0021801 A1* | 1/2009 | Ishihara | G02B 26/105 358/475 |
| 2012/0206784 A1* | 8/2012 | Chan | G02B 26/0833 359/212.1 |

\* cited by examiner

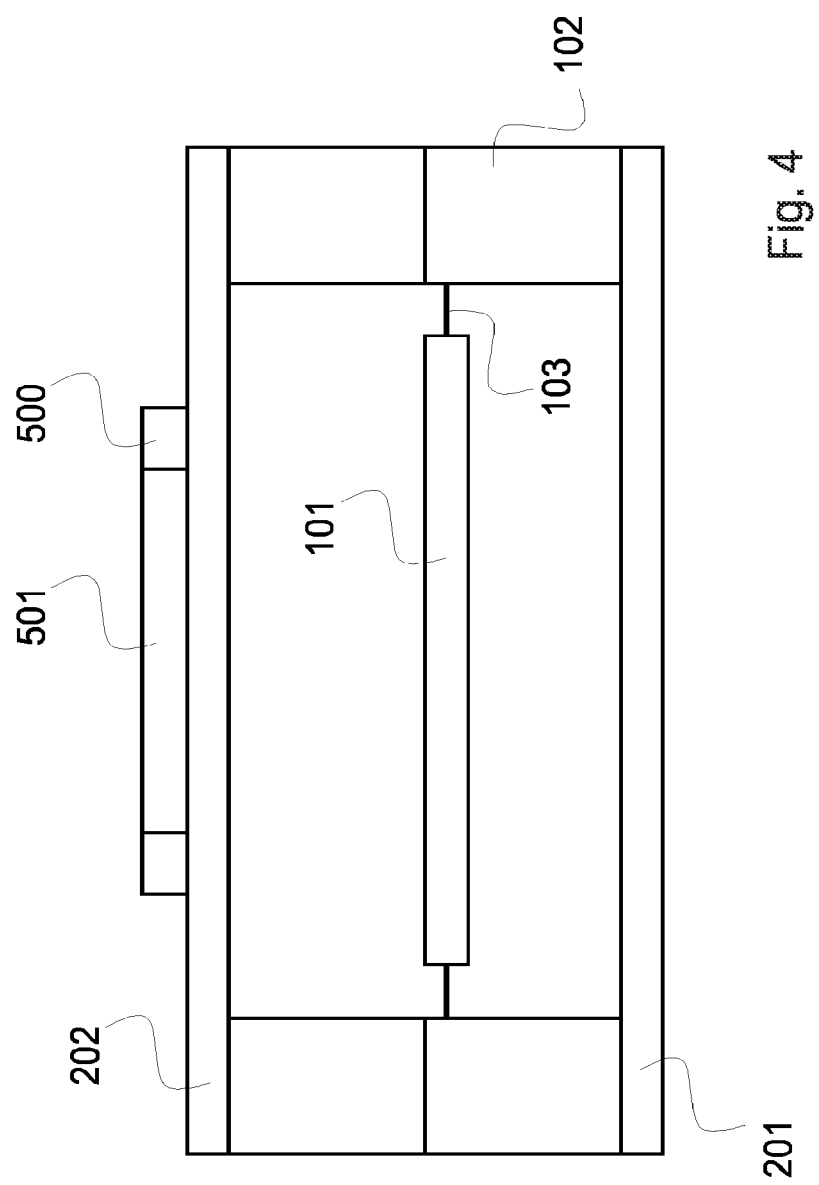

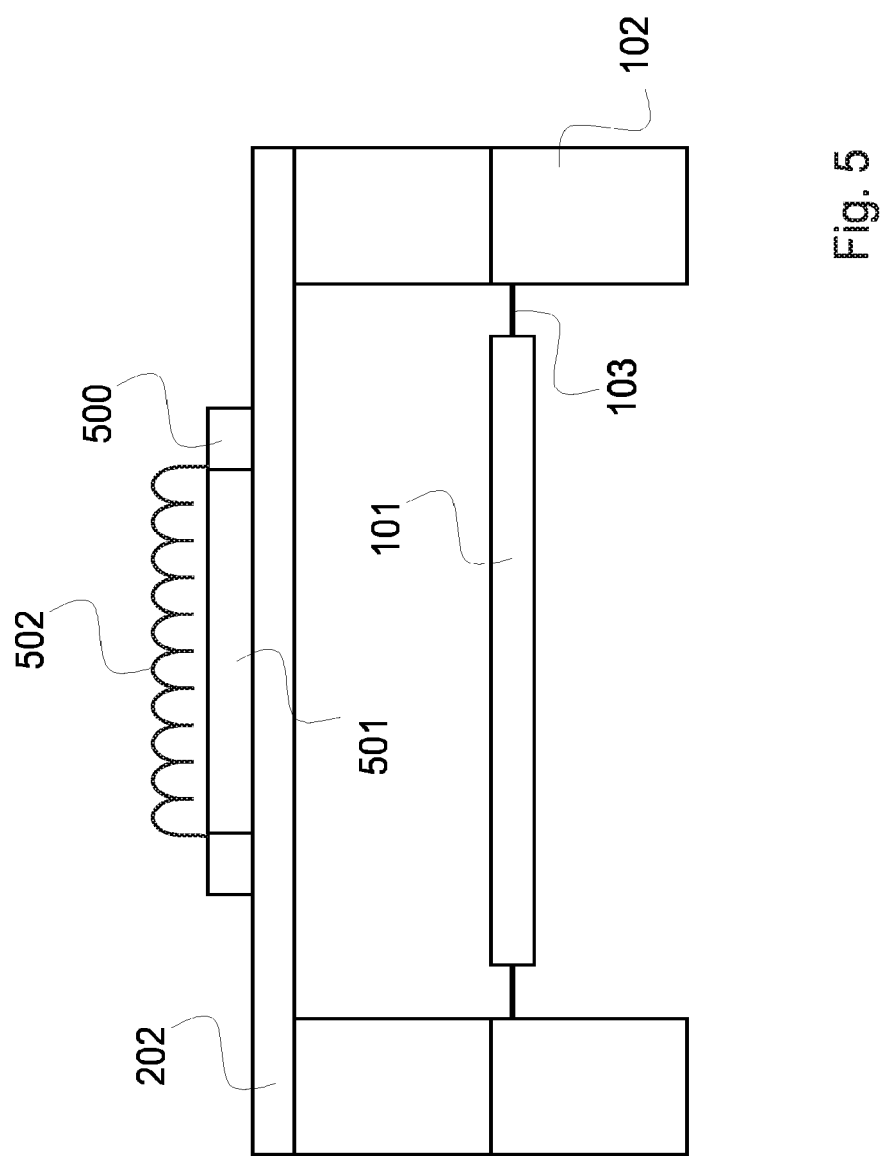

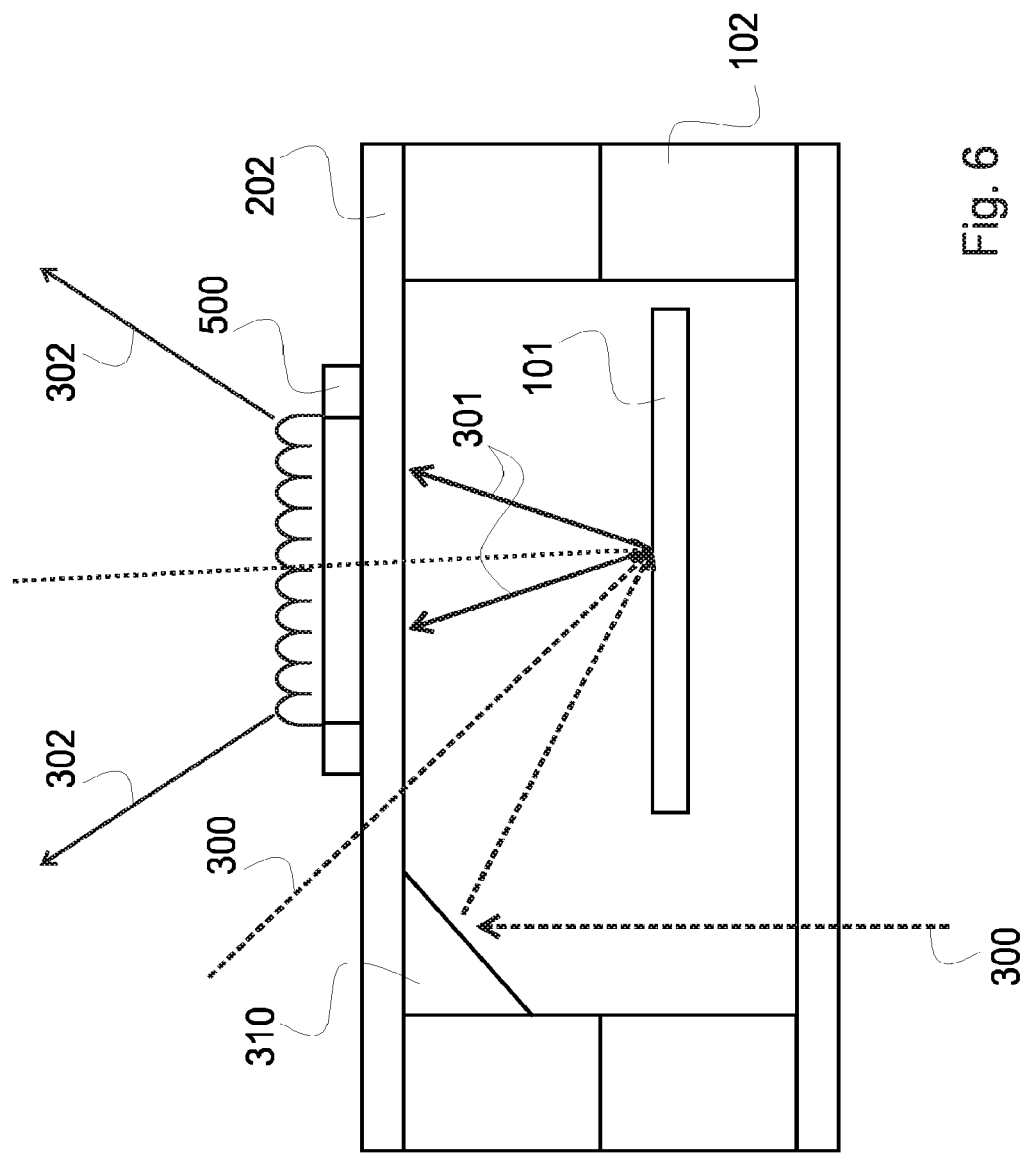

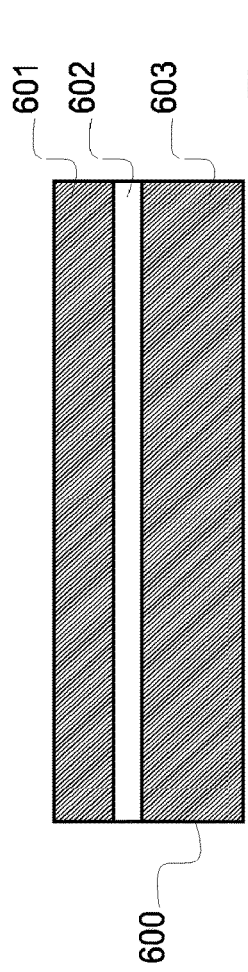
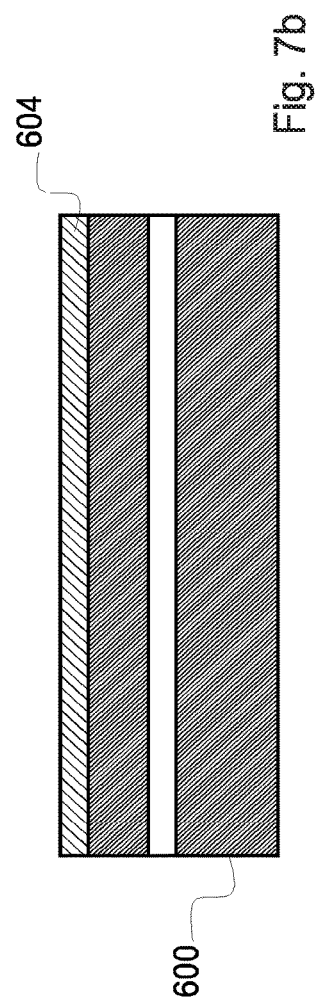
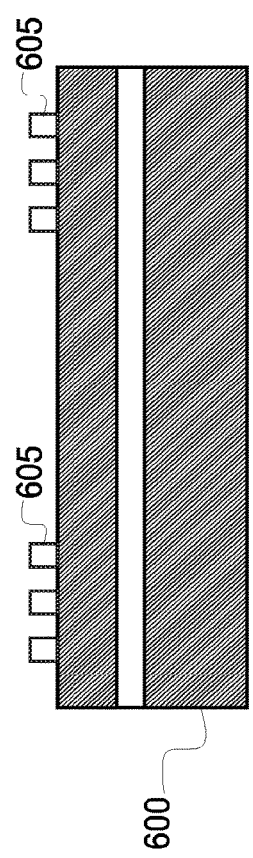

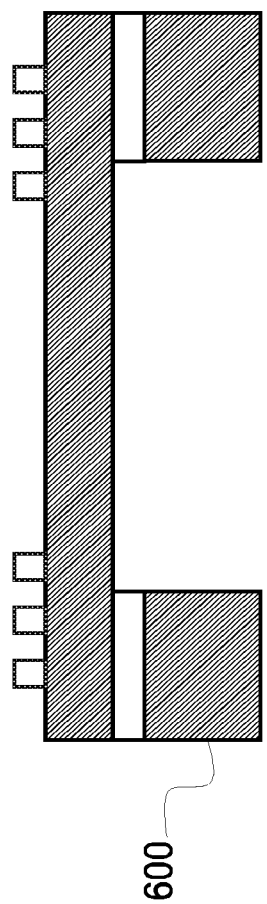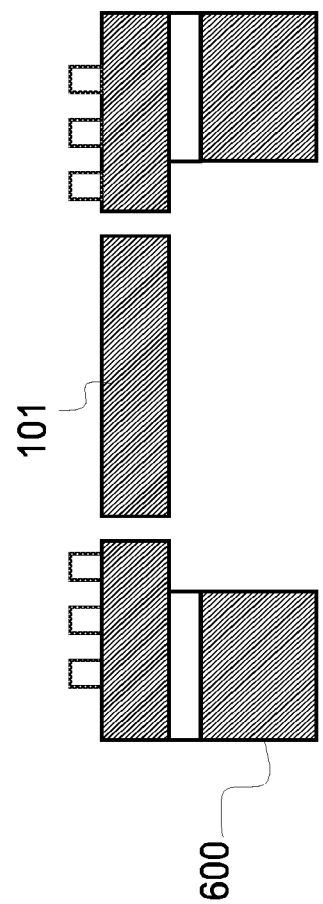

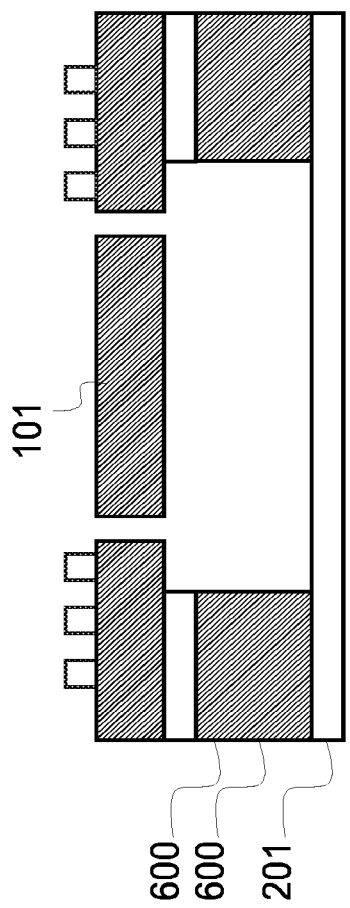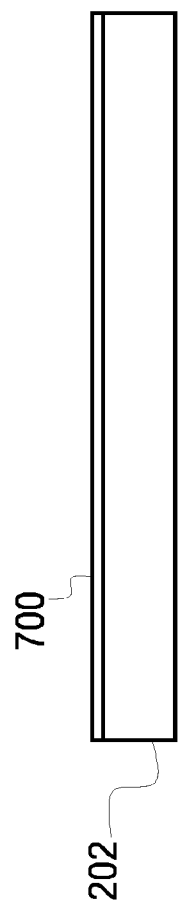

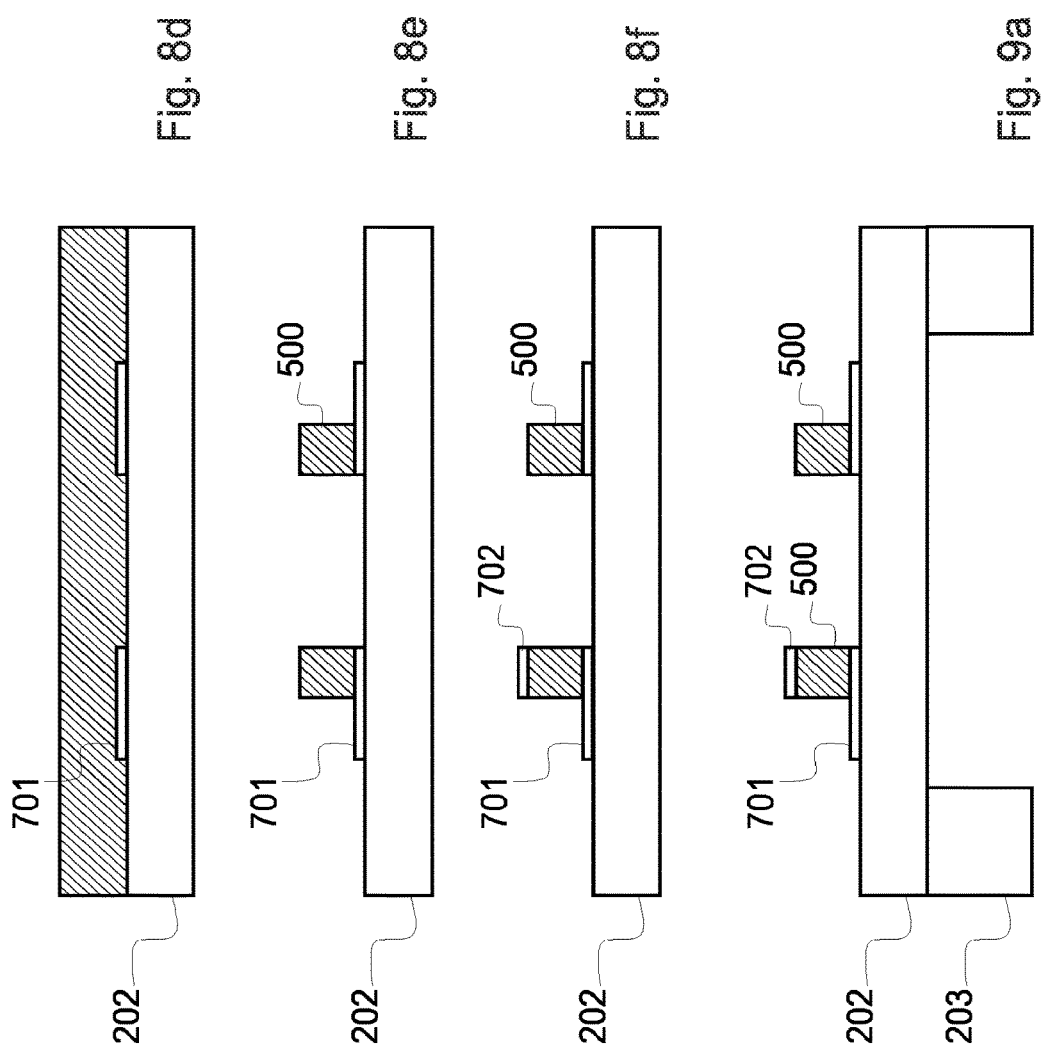

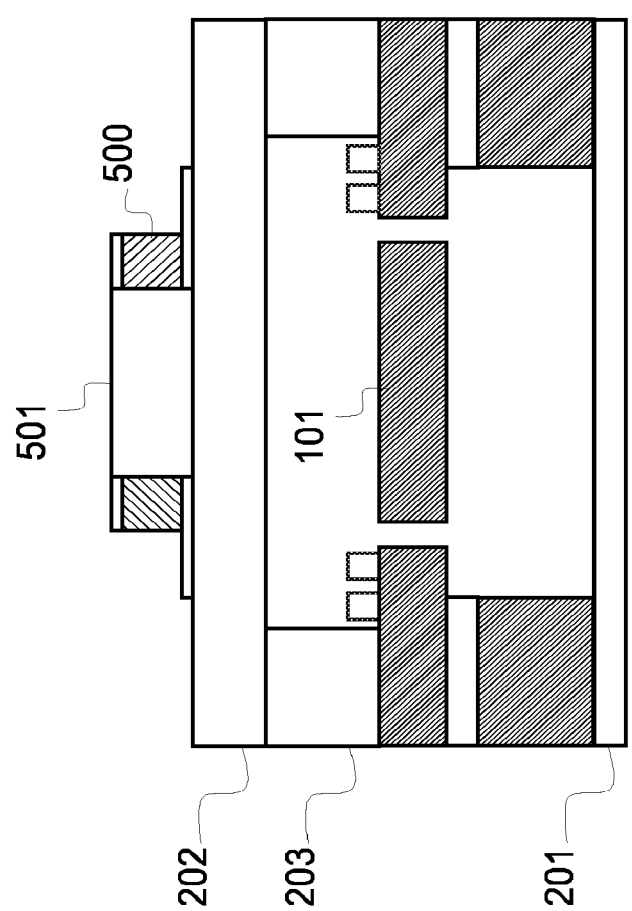

OPTICAL MEMS SCANNING MICRO-MIRROR WITH ANTI-SPECKLE COVER

CROSS-REFERENCE TO RELATED APPLICATIONS

This application is a Continuation of U.S. patent application Ser. No. 14/692,517 filed Apr. 21, 2015 which is a Continuation of U.S. patent application Ser. No. 13/638,308 filed May 23, 2013, which is a national stage application claiming the benefit of and priority to International Application No. PCT/EP2010/055764 filed Apr. 28, 2010, all of which are hereby incorporated by reference in their entirety.

FIELD OF THE INVENTION

The present invention relates to an optical MEMS scanning micro-mirror comprising
a movable scanning micro-mirror being pivotally connected to a MEMS body substantially surrounding the lateral sides of the micro-mirror, a substrate covering a back face of said mirror and a transparent window substantially covering the reflection side of the micromirror. The present invention also relates to a micro-projection system comprising such a micro-mirror, a corresponding method for reducing speckle and a method for manufacturing the optical MEMS scanning mirror.

BACKGROUND OF THE INVENTION

Speckle is a phenomenon created with laser light sources, due to the fact that laser light is coherent. Parallels and synchronized wavefronts simultaneously hit the projection surface. When the light hits the surface, it creates constructive and destructive interference. The first category of interference induces an image deterioration that is often visible by human eye and/or by sensors. In addition to a loss of image quality, visual comfort of the viewer may also be affected.

Several techniques are used in order to remove or reduce speckle. In many cases, light coherence reduction techniques are used. For instance, the light hitting the projection surface is provided from various projection angles. Polarized laser light hitting a depolarized film is also used. Otherwise, illumination using various laser wavelengths may also be used.

Another approach consists in using vibration of the projection surface. The resulting systems are complex, expensive, and involve very specific hardware material.

WO2009/077198 describes an optical system comprising a coherent light source and optical elements for directing light from the source to a target. The optical elements include at least one diffusing element arranged to reduce a coherence volume of light from the source and a variable optical property element. A control system controls the variable optical property element such that different speckle patterns are formed over time at the target with a temporal frequency greater than a temporal resolution of an illumination sensor or an eye of an observer so that speckle contrast ratio in the observed illumination is reduced. The variable optical property element may be a deformable mirror with a vibrating thin plate or film. This solution requires modifying the projection system in order to integrate additional components, such as diffusing elements.

WO2007/112259 describes a system and method for reducing or eliminating speckle when using a coherent light source. A refracting device, comprising a birefringent material, is positioned such that the refracting device intercepts the coherent light. The refracting device rotates, thereby causing the ordinary and/or extraordinary beams to move. The human eye integrates the movement of the beams, reducing or eliminating laser speckle. The refracting device may include one or more optical devices formed of a birefringent material. Wave plates, such as a one-half wave plate, may be inserted between optical devices to cause specific patterns to be generated. Multiple optical devices having a different orientation of the horizontal component of the optical axis may also be used to generate other patterns. Furthermore, the refracting device may include an optical device having multiple sections of differing horizontal components of the optical axis. This solution involves a complex and expensive component, the rotating refracting device. Moreover, the integration of such device requires a specific global design.

CN101477234 discloses a piezo-driven optical lens, which comprises a lens body, rails for providing an axial motion path, a piezoelectric element for providing a driving force and an elastic element for providing pre-stress for contacting the piezoelectric element with the rails. The lens body is at least provided with a hollow seat body, a lens barrel which is capable of moving axially and is positioned in the hollow seat, and a lens group fixed on the lens barrel. The piezoelectric element contacts the rails through the elastic element to drive the lens barrel to move linearly along the rails. This solution provides an efficient auto-focus system, but is not adapted to reduce speckle.

WO 9918456 describes a lens with variable focus comprising a chamber filled with a first liquid, a drop of a second liquid being provided on a first surface zone of the chamber wall, wherein the chamber wall is made of an insulating material. The first liquid is conductive, the second liquid insulating. The first and second liquid are immiscible, with different optical indices and substantially of the same density. Means are provided for positioning said drop in inoperative position on said zone, comprising electrical means for applying a voltage stress between the conductive liquid and an electrode arranged on said wall second surface, and centering means for maintaining the centering and controlling the shape of the drop edge while a voltage is being applied by electrowetting. This solution involves complex liquid/oil encapsulated system and electrostatic actuation.

US2009040602 describes a stress-induced polarization converter in the form of a zero power optical window or, alternatively, a single element, positive or negative power optical lens, that is subject to a controlled amount of symmetric, peripheral stress. The stress may be provided by appropriate mechanical, thermal, hydraulic, electromagnetic/piezo, annealing/molding, or other known techniques. The applied symmetric stress will advantageously be trigonal or four-fold, but is not so limited. This solution involves symmetrical stress, which is not suited for speckle reduction.

Thus, there is a need for a novel micro-projection system with reduced speckle having MEMS micro-mirrors and MEMS components in general, that does not present the above mentioned drawbacks, namely the complexity and costs problems caused by using specific configurations with additional components used only for speckle reduction.

SUMMARY OF THE INVENTION

A general aim of the invention is therefore to provide an improved device and method for reducing or suppressing speckle in a laser micro-projection system.

Still another aim of the invention is to provide such method and device for reducing or suppressing speckle, providing efficient performances at reasonable cost.

Yet another aim of the invention is to provide such method and device for reducing or suppressing speckle, using components that can be fully integrated into a laser micro-projection device.

These aims are achieved thanks to the optical MEMS scanning micro-mirror and to the micro-projection system defined in the claims.

There is accordingly provided an optical MEMS scanning micro-mirror comprising:
- a movable scanning 1D or 2D micro-mirror, being pivotally connected to a MEMS body for deflecting a light beam;
- a layer of deformable transparent material arranged to be traversed by said light beam;
- a piezo-actuator assembly cooperating with said transparent material so that when actuated, the piezo-actuator assembly causes micro-deformation of the transparent material so as to reduce speckle.

The anti-speckle effect is obtained by arranging and actuating the piezo-actuator so as to create deformations of the transparent material with a short spatial wavelength (preferably much shorter than the outer dimension of the transparent material, thus creating waves) and/or with a high temporal frequency, so as to change the deformation between each successive frame.

In an advantageous embodiment, the MEMS scanning mirror further comprises a package with a transparent window substantially above a reflection side of the micro-mirror, said layer of deformable transparent being unitary with said window.

In a further embodiment, the MEMS scanning mirror further comprises a substrate under a back face of said mirror;
- wherein said piezo-actuator assembly and said layer of deformable transparent material are provided on the outer portion of said window;
- wherein said piezo-actuator assembly is arranged at the periphery of the layer of transparent material.

In an advantageous embodiment, the piezo-actuator assembly is substantially circumferential.

In a variant, the piezo-actuator assembly is provided with a plurality of piezo-elements circumferentially arranged around the transparent material.

The window is preferably provided with a substantially flat outer face on which the piezo-actuator assembly and the transparent material are attached.

The piezo actuator assembly is advantageously driven on an irregular basis.

In a preferred embodiment, the piezo-actuator assembly, the transparent layer and window are preferably fabricated at wafer-level.

The invention also provides a micro-projection system for projecting light on a projection surface comprising:
- at least one coherent light source and preferably a plurality of light sources with a beam combiner;
- optical elements, in the optical path between said coherent light source and said projection surface,
- an optical MEMS scanning micro-mirror as previously described.

Such a micro-projection system may comprise in addition to the micro-mirror and the light source(s), a quarter-wave plate, a beam splitter, beam combiner, etc.

The invention further provides a method for reducing speckle in a micro-projection system adapted for projecting light on a projection surface, comprising:
- providing a light with at least one coherent light source;
- directing light from the light source to the projection surface;
- providing a scanning micro-mirror for deviating light from said light source so as to scan a projected image onto said projecting surface;
- providing a layer of deformable transparent material arranged to be traversed by said light beam;
- providing a piezo-actuator assembly cooperating with said transparent material so that when actuated, the piezo-actuator assembly causes micro-deformation of the transparent material so as to reduce speckle.

The piezo-actuator assembly and deformable material configuration enables to deform the transparent material to get an irregular surface varying according to the crossing position of the beams. Thus, several parallel light beams crossing the deformed surface are impacted differently (spatial deformation) while the deformation of each point also varies with time. Therefore, the deformed surface is specifically adapted to slightly modify the angle between adjacent light beams, resulting in a reduced coherence, and reduced speckle effect.

In an advantageous embodiment, the piezo-actuator assembly is actuated so as to create deformations of the transparent material with a spatial wavelength shorter than the average outer dimension of the transparent material, thus creating waves in said transparent material.

In a variant, the piezo-actuator assembly is actuated with a temporal frequency adapted to change the deformation between each successive pixel.

In a further variant, the above two deformation modes are combined, in order to enhance the performance.

The invention further provides a method for manufacturing an optical MEMS scanning micro-mirror, comprising:
- providing a MEMS micro-mirror for deflecting a light beam;
- providing a transparent substrate arranged to be traversed by said light beam;
- deposing a piezo-actuator assembly on one side of the substrate, said assembly forming a substantially central cavity;
- providing said cavity with a layer of deformable transparent material.

In a preferred embodiment, the substrate is advantageously a glass window.

In the above method, the piezo-actuator assembly is preferably obtained by:
- deposing a metallic layer on the surface of the substrate, for forming an electrode;
- removing the excess of material to leave a substantially circumferential portion for receiving the piezo material;
- deposing piezo material on said electrode portion;
- removing the excess of piezo material to leave a substantially circumferential piezo-actuator assembly;
- deposing a metallic layer on said piezo-actuator assembly;
- providing at least one layer of deformable transparent material within the piezo-actuator assembly.

The method advantageously further comprises the step of providing a spacer wafer (for instance with Silicon or glass) on said substrate, on the side opposite to said piezo-actuator assembly.

In a preferred embodiment, the method still further comprises the step of attaching the substrate (for instance by anodic bonding, gluing, eutectic bonding, glass frit bonding, etc) to the reflection side of the micro-mirror.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 4 shows an optical MEMS scanning micro-mirror provided with a piezo-actuator assembly in accordance with the invention;

FIG. 5 shows the optical MEMS scanning micro-mirror of FIG. 4 with a schematic representation of the deformable transparent material when the piezo-actuator assembly is actuated.

FIG. 6 shows the optical MEMS scanning micro-mirror of FIG. 4 with a schematic representation of the deformable transparent material when the piezo-actuator assembly is actuated, and the resulting light reflections and transmission principles;

FIGS. 7a to 7f, 8a to 8f and 9a to 9c are schematic illustrations of an improved manufacturing process for an anti-speckle MEMS scanning mirror in accordance with the invention;

DETAILED DESCRIPTION OF THE INVENTION

For clarity, as is generally the case in representation of microsystems, the various figures are not drawn to scale.

Figure 1:
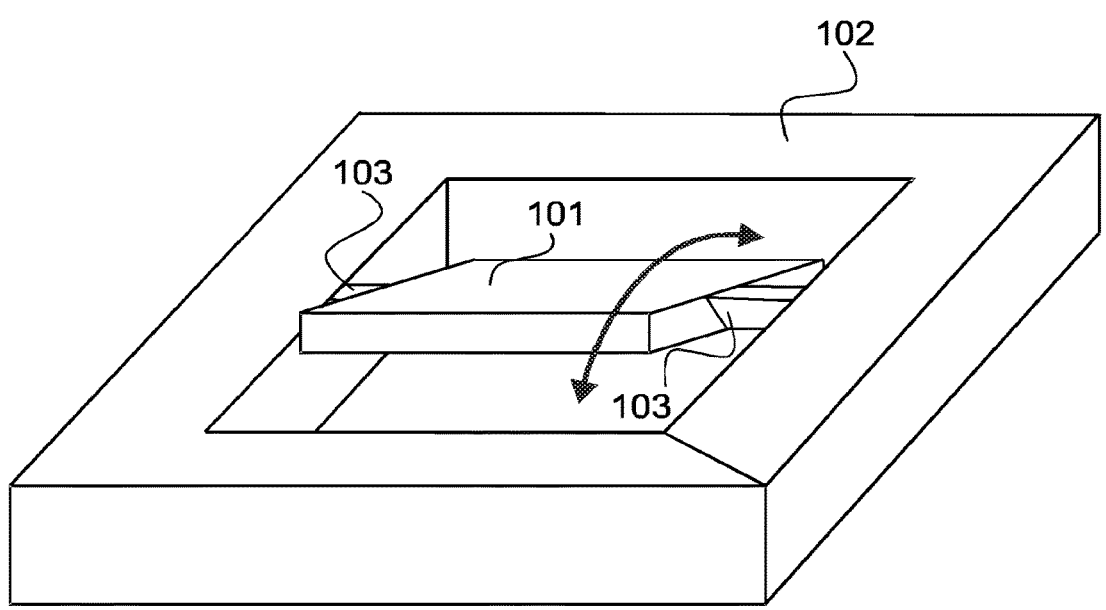
FIG. 1 describes a movable micro-mirror.

FIG. 1 presents a typical rectangular MEMS moving micro-mirror 101, anchored to a fix body 102 by two beams 103, and deflected along its central axis.

Figure 2A:
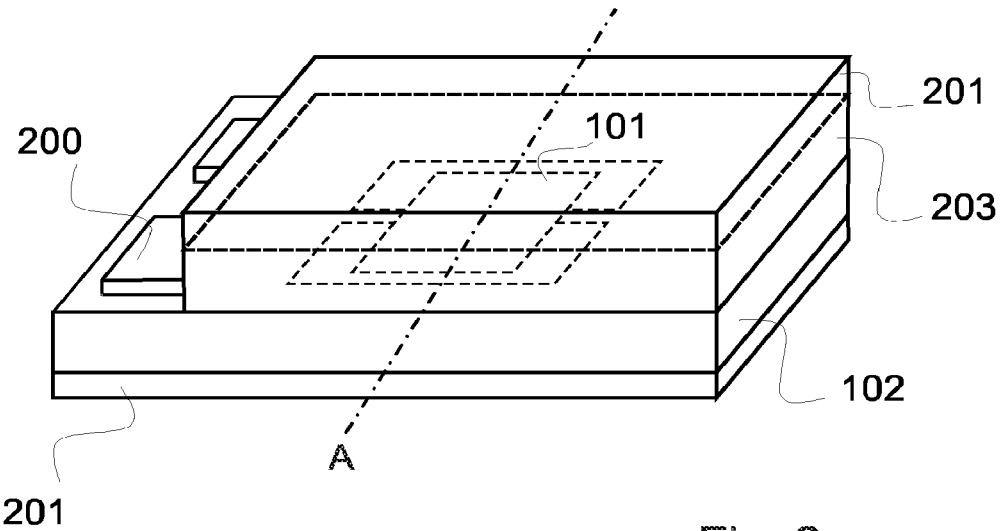
FIG. 2A and FIG. 2B describe respectively a protected micro-mirror and its cross section.
Figure 2B:
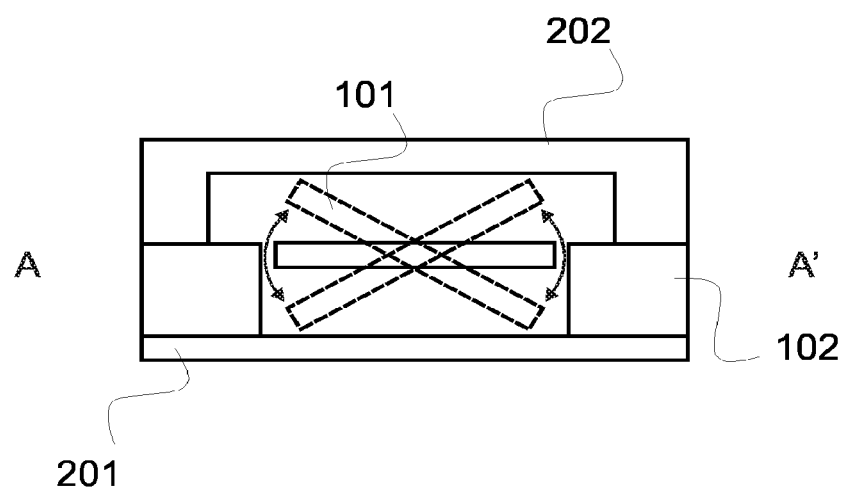

An example of known type packaged MEMS minor is presented in FIG. 2A and FIG. 2B, where the MEMS minor 101 is protected by a package comprising in this example transparent or semi-transparent surfaces 201 and 202 as the incoming light can either come from one side or from two sides of the minor surfaces.

The package of the encapsulated MEMS micro-mirror comprises a cap part with an optical window 202 that allows the light to penetrate and reflects on the micro-mirror surface. The cap optical window is typically made of glass such as borosilicate glass (for instance borofloat) or other type of glass, and has usually a flat surface. Micro-mirror surface can also be coated with reflective material such as gold, aluminum or silver, deposited in thin film, to obtain strong light reflection in the visible and Infra-Red wavelength. Optionally, the MEMS micro-mirror chip can also be packaged by a transparent or opaque substrate 201 from the other side of the MEMS micro-mirror chip. Ideally, each of the protection substrates made of transparent material should be coated on both sides with anti-reflective coating to avoid any parasitic light reflection.

Figure 3:
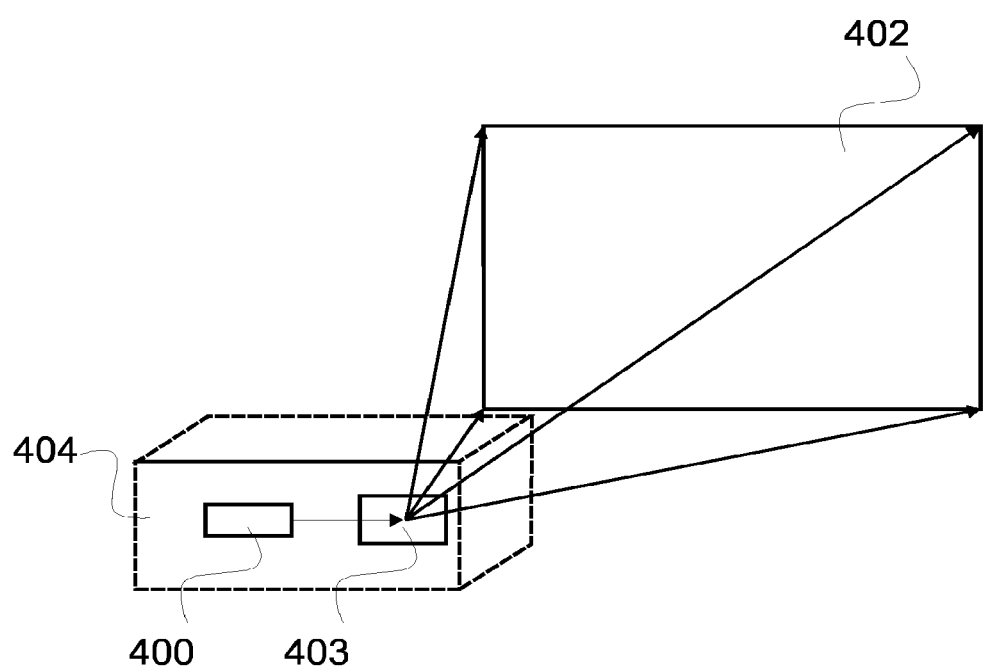
FIG. 3 is a schematic representation of a projection or scanning system comprising a light source and a micro-mirror.

FIG. 3 presents a micro-projection system 404 where the light beam, coming from the light source 400, is reflected into the optical projection system chip 403, resulting in a projection image 402.

An aspect of the invention consists in reducing or suppressing speckle and therefore improves image quality and stability. FIG. 4 illustrates a MEMS scanning micro-mirror provided with a piezo-actuator 500, attached to the transparent window 202 of the package for the scanning mirror. The piezo-actuator is preferably arranged with a substantially circular configuration in order to form a cavity in which a layer of deformable transparent material 501 is placed. The latter two elements are in close cooperation so that piezo actuation creates a random or irregular deformation 502 of the transparent material 501, as shown in FIG. 5. It is to be noted that the deformation shown in FIG. 5 is voluntarily oversized, for illustrative purpose only. Actuation of the piezo-actuator causes alternate contractions and extensions of the transparent material 501, thereby deforming it, as illustrated. The deformation reduces the laser coherence of light crossing the transparent material, which reduces the perceived speckle effect.

In other words, when light beams providing one pixel or multiple adjacent pixels cross the transparent material in portions having different deformations, speckle may be reduced or suppressed. To provide such effect, in an embodiment, a high spatial frequency is used to generate waves 502, as shown in FIGS. 5 and 6. It is even possible in one embodiment to vibrate the piezoelectric element fast enough to change the deformation of the deformable material during the projection time of one single pixel, thus reducing the speckle of each projected pixel.

In a second embodiment, the various successive deformations are rapidly generated, so that deformations successively supported by the same pixels in different frames are different. This requires a substantially high temporal frequency, for instance at least equal to, and preferably greater than the frame frequency.

In a variant, both previous techniques are combined to enhance the results.

FIG. 6 illustrates exaggerated examples of input light and reflection when the piezo-actuator 500 is actuated. Input light 300 is reflected by the scanning mirror 101 and guided to the projection target in order to form a projected image. The reflected light 301 from the scanning mirror passes through the transparent window 202 and the deformed transparent material 501. The deformation of the latter slightly modifies the direction of the reflected light, as shown with arrows 302, illustrating the deviated light. The deviation is minimal and temporary, in order not to affect image quality, but sufficient to reduce the speckle effect. Also this pixel deviation can be compensated by software during the image projection, so as to change the phase of the laser pulse and send it slightly in advance or slightly delayed, thus changing its position.

In other words, the different light beams cross the deformable material at different positions involving different orientations of the material, due to the vibrations of the material. The beams are slightly deviated, as shown in FIG. 6. This reduces the constructive and destructive interferences when the beams reach the screen.

FIG. 6 also presents examples of input light 300, either from the top of the scanning mirror or from the bottom direction. In the latter case, an angled reflector 310 is required in order to deviate the light to the scanning mirror 101. Such reflector may be provided with silicon or glass coated with a metallic reflective layer, in this example directly under window 202.

The circular shape of the piezo-actuator 500 may be continuous along the periphery of the centrally placed deformable material 501, or discontinuous, with regular or irregular interruptions along the circular profile. The transparent material may be a polymer, silicones such as Polydimethylsiloxane (PDMS) or a sufficiently viscous plastic, or other material that is capable of a light deformation when actuated by a piezo-actuator.

The piezo element 500 and the deformable material 501 are preferably manufactured at wafer level with the transparent window 202 on which they are attached, as explained hereafter.

FIGS. 7a to 7f, 8a to 8f and 9a to 9c are schematic illustrations of an improved manufacturing process for the anti-speckle MEMS scanning mirror of the invention. These Figures are completed with FIG. 10 showing a process flow chart with certain process steps carried out in a fabrication process for fabricating the MEMS components. First, the core MEMS processing is shown (steps 2 to 14 of FIG. 10). A known type SOI wafer 600 (FIG. 7a) comprising two silicon layers 601 and 603 placed on each side of a silicon oxide layer 602 is used as a base material for manufacturing the scanning mirror (step 2). FIG. 7b depicts the SOI wafer provided with metal deposition 604 such as aluminum or copper (step 4). FIG. 7c shows the metal layer 605 after etching (step 6). FIG. 7d presents the silicon 603 etching, for instance dry or wet etching, followed by oxide 602 etch (dry or wet) (steps 8 and 10). FIG. 7e shows the silicon 601 dry etch to form the micro-mirror 101 portion (step 12). In FIG. 7f, a transparent glass window 201 made for instance with borosilicate glass (such as borofloat) or other type of glass, is bonded to the wafer (step 14). The glass window may be attached to the micro-mirror chip using any techniques, including but not limited to gluing, glass frit bonding, anodic bonding, eutectic bonding, molecular bonding, fusion bonding, low temperature direct bonding, soft soldering, metal thermo compression bonding, bonding with reactive multilayer, laser bonding, polymer attach, etc.

FIGS. 8a to 8f show the different steps of the cap processing. FIG. 8a shows the unprocessed substrate, in this case a transparent glass window (step 16). A metal deposition step is performed as shown in FIG. 8b, to add a thin layer 700 of metal alloy such as aluminum, to form an electrode 701 (step 18). Excess of metal is removed by etching (wet or dry) as shown in FIG. 8c (step 20). FIG. 8d shows the deposition of the piezo material (step 22). A material such as lead zirconate titanate (commonly designated "PZT") or other natural or man-made piezo material such as Aluminum Nitride (AlN) may be used. Etching enables the removal of not-required piezo material, as shown in FIG. 8e, leaving the piezo-actuator 500 (step 24). The piezo-actuator section is preferably larger than the underlying electrode 701. The second electrode 702 is provided on top of the piezo-actuator 500 by metal deposition, as shown in FIG. 8f (step 26).

A spacer wafer 203 such as Si or glass material is afterwards attached to the glass window, as shown in FIG. 9a (step 28). The spacer may be attached to the micro-mirror chip using any techniques, including but not limited to gluing, glass frit bonding, anodic bonding, eutectic bonding, molecular bonding, fusion bonding, low temperature direct bonding, soft soldering, metal thermo compression bonding, bonding with reactive multilayer, laser bonding, polymer attach, etc.

Figure 9B:
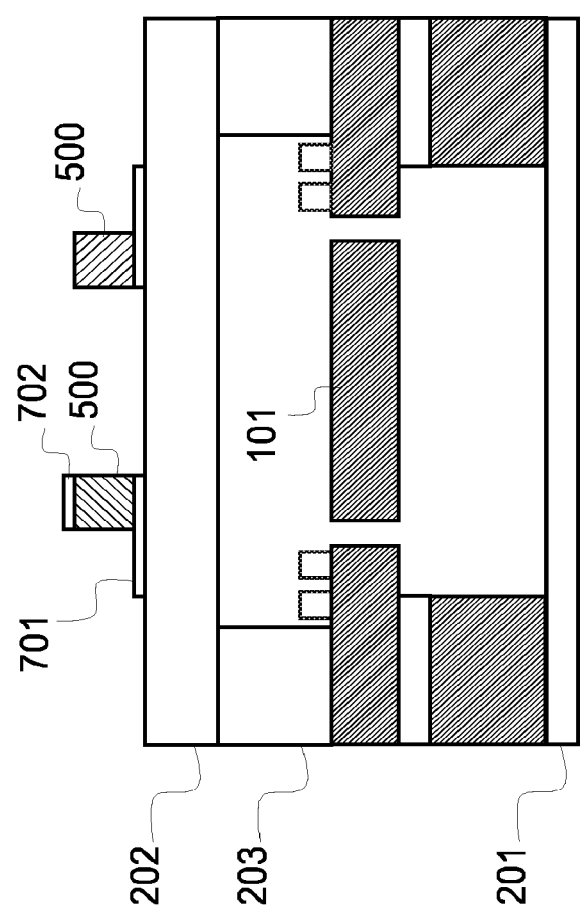
Figure 10:
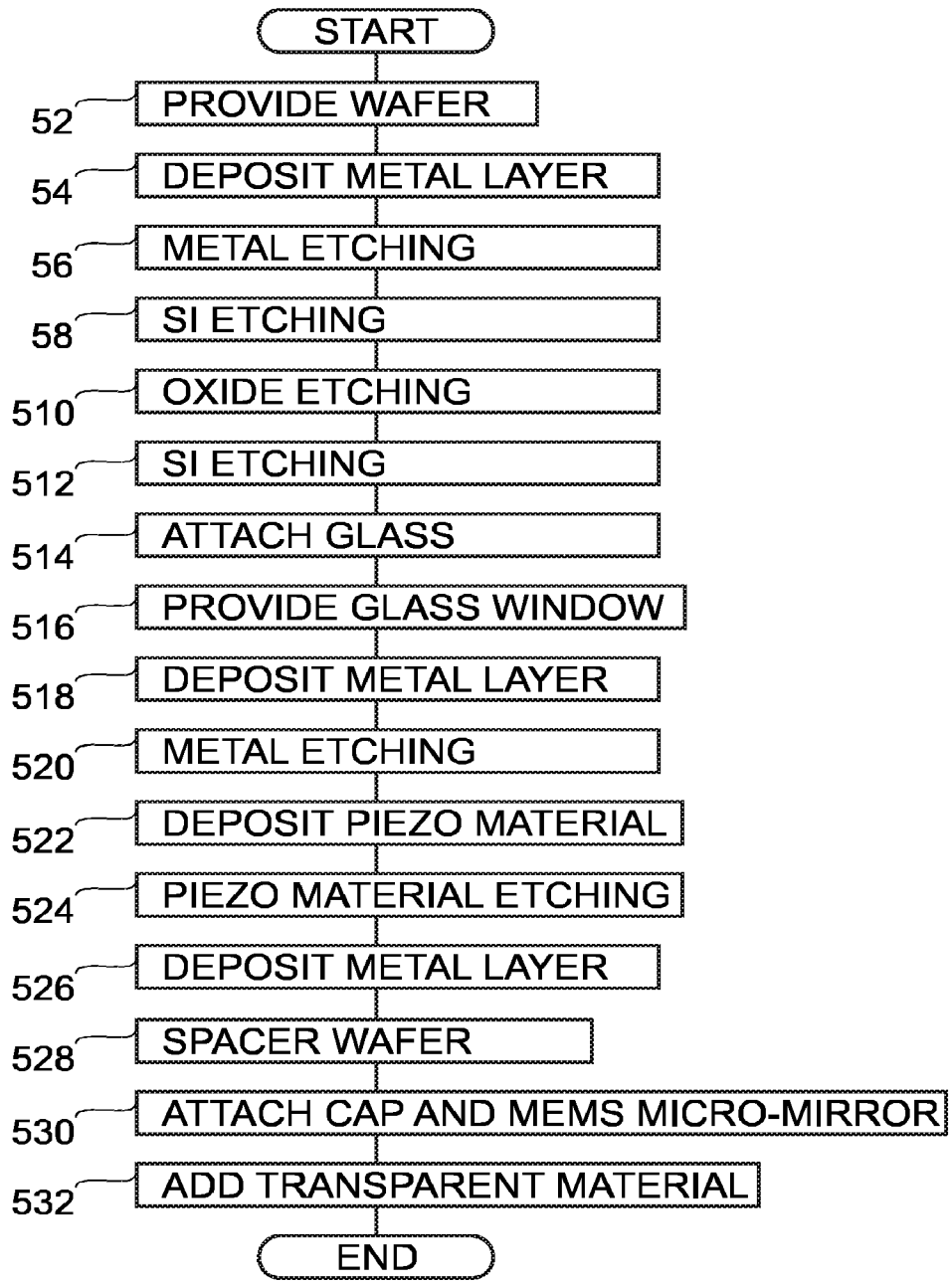
FIG. 10 shows a process flow chart with certain process steps carried out in a fabrication process for fabricating the MEMS components of FIG. 4.

A similar type of attachment is used to connect the cap wafer stack to the MEMS mirror stack assembly, as illustrated in FIG. 9b (step 30). FIG. 9c show the addition of the deformable transparent material 501 within the cavity defined by the piezo-actuator 500 (step 32). The layer is preferably substantially flat for proper operation. The addition of the deformable material 501 can be done using different techniques, including plastic injection, PDMS or PMMA molding.

What is claimed is:

1. An Optical micro-electro mechanical system (MEMS) scanning micro-mirror device comprising:
    a movable scanning micro-mirrors for deflecting a light beam;
    a layer of deformable transparent material arranged to be traversed by said light beam; and
    a piezo-actuator cooperating with said transparent material so that when actuated, the piezo-actuator causes micro-deformation of the transparent material.

2. The optical MEMS scanning micro-mirror according to claim 1, further comprising: a package with a transparent window substantially above a reflection side of the micromirrors, said layer of deformable transparent being unitary with said window.

3. The optical MEMS scanning micro-mirror according to claim 2, further comprising:
    a substrate under a back face of said mirror; wherein said piezo-actuator and said layer of deformable transparent material are provided on an outer portion of said window; and
    wherein said piezo-actuator is arranged at a periphery of the layer of deformable transparent material.

4. The optical MEMS scanning micro-mirror according to claim 1, wherein the piezo-actuator is substantially circumferential.

5. The optical MEMS scanning micro-mirror according to claim 1, wherein the piezo-actuator is provided with a plurality of piezo-elements circumferentially arranged around the layer of deformable transparent material.

6. The optical MEMS scanning micro-mirror according to claim 2, wherein the window is provided with a substantially flat outer face on which the piezo-actuator and the layer of deformable transparent material are attached.

7. The optical MEMS scanning micro-mirror according to claim 2, wherein the piezo-actuator, the layer of deformable transparent material and the window are fabricated at waferlevel.

8. A method for reducing speckle in a micro-projection system adapted for projecting light on a projection surface, comprising:
    providing a light with at least one coherent light source;
    directing light from the light source to the projection surface;
    providing a scanning micro-mirror for deviating light from said light source so as to scan a projected image onto said projecting surface; and
    providing a layer of deformable transparent material arranged to be traversed by said light; and providing a piezo-actuator assembly cooperating with said transparent material so that when actuated, the piezo-actuator assembly causes micro-deformation of the transparent material so as to reduce speckle.

9. The method for reducing speckle in a micro-projection system according to claim 8, wherein the piezo-actuator is actuated so as to create deformations of the transparent material with a spatial wavelength shorter than an average outer dimension of the transparent material, thus creating waves in said transparent material.

10. The method for reducing speckle in a micro-projection system according to claim 8, wherein the piezo-actuator is actuated with a temporal frequency adapted to change the deformation within one single pixel, between each pixel or between each successive frame.

11. A system, comprising:
a light source to emit a light beam;
a transparent material;
a moveable mirror to receive the light beam and scan the light beam across the transparent material;
an actuator coupled to the transparent material and arranged to deform the transparent material.

12. The system of claim 11, the actuator to cause micro-deformations in the transparent material to reduce speckle.

13. The system of claim 11, further comprising a package having an aperture, at least the moveable mirror disposed inside the package such that the aperture is above a reflection side of the moveable mirror, the transparent material covering the aperture.

14. The system of claim 13, wherein the actuator is disposed at a periphery of the transparent material.

15. The system of claim 13, wherein the aperture comprises a substantially flat outer face, the actuator and the transparent material attached to the substantially flat outer face.

16. The system of claim 11, wherein the actuator is a piezo-actuator.

17. The system of claim 11, wherein the actuator comprises a plurality of piezo-actuator elements circumferentially arranged around the transparent material.

18. The system of claim 11, comprising a substrate, the moveable mirror, the actuator and the transparent material formed on the substrate.

19. The system of claim 11, wherein the light beam is a coherent light beam.

20. The system of claim 11, wherein the transparent material comprises borosilicate and the actuator comprises at least one of zirconate titanate and aluminum nitride.

* * * * *